United States Patent
Jung et al.

(10) Patent No.: US 9,401,201 B1
(45) Date of Patent: Jul. 26, 2016

(54) WRITE DRIVER FOR MEMORY

(71) Applicant: QUALCOMM Incorporated, San Diego, CA (US)

(72) Inventors: Chulmin Jung, San Diego, CA (US); Fahad Ahmed, San Diego, CA (US); David Li, San Diego, CA (US); Sei Seung Yoon, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/720,383

(22) Filed: May 22, 2015

(51) Int. Cl.
| | | |
|---|---|---|
| *G11C 11/41* | (2006.01) | |
| *G11C 11/419* | (2006.01) | |
| *G11C 5/14* | (2006.01) | |
| *G11C 11/413* | (2006.01) | |
| *G11C 16/10* | (2006.01) | |
| *G11C 16/06* | (2006.01) | |
| *G11C 7/12* | (2006.01) | |
| *G11C 7/10* | (2006.01) | |
| *G11C 13/00* | (2006.01) | |

(52) U.S. Cl.
CPC .............. *G11C 11/419* (2013.01); *G11C 5/14* (2013.01); *G11C 5/143* (2013.01); *G11C 5/147* (2013.01); *G11C 7/1078* (2013.01); *G11C 7/1096* (2013.01); *G11C 7/12* (2013.01); *G11C 11/413* (2013.01); *G11C 13/0069* (2013.01); *G11C 16/06* (2013.01); *G11C 16/10* (2013.01)

(58) Field of Classification Search
CPC .......... G11C 5/14; G11C 5/143; G11C 5/147; G11C 11/413; G11C 11/419; G11C 16/10; G11C 16/06; G11C 7/12; G11C 7/1078; G11C 7/1096; G11C 13/0069
See application file for complete search history.

(56) References Cited

U.S. PATENT DOCUMENTS

| | | | |
|---|---|---|---|
| 7,053,657 B1 * | 5/2006 | Peng ................ | H03K 3/356113 326/68 |
| 7,098,692 B2 | 8/2006 | Joshi et al. | |
| 7,236,410 B2 | 6/2007 | Schrom et al. | |
| 7,773,405 B2 * | 8/2010 | Sakimura ............... | G11C 11/16 365/130 |
| 8,217,685 B2 | 7/2012 | Scott et al. | |
| 8,456,929 B2 | 6/2013 | Liles et al. | |
| 8,687,409 B2 * | 4/2014 | Ikeda .................. | G11C 13/0007 365/148 |
| 8,976,607 B2 * | 3/2015 | Desai .................... | G11C 7/1096 365/189.05 |
| 9,058,858 B2 * | 6/2015 | Cheng ....................... | G11C 8/10 |
| 2007/0188194 A1 * | 8/2007 | Yang .............. | H03K 19/018528 326/80 |
| 2014/0185367 A1 | 7/2014 | Ngo et al. | |
| 2014/0269112 A1 * | 9/2014 | Jung ........................ | G11C 7/12 365/189.11 |
| 2016/0071574 A1 * | 3/2016 | Hess ..................... | G11C 11/419 365/156 |

* cited by examiner

*Primary Examiner* — Vanthu Nguyen
(74) *Attorney, Agent, or Firm* — Arent Fox LLP

(57) ABSTRACT

A memory and a method for operating a memory are provided. The memory includes a memory cell configured to be powered from a first voltage source, a bitline, and a write driver configured to write to the memory cell through the bitline, the write driver comprising a pull-up circuit to pull up bitline voltage towards a second voltage source while using the first voltage source to limit the bitline voltage, the first and second voltage sources being in different voltage domains.

18 Claims, 7 Drawing Sheets

WRITE DRIVER FOR MEMORY

BACKGROUND

1. Field

The present disclosure relates generally to electronic circuits, and more particularly, a write driver for memory.

2. Background

With the ever increasing demand for more processing capability in mobile devices, low power consumption has become a common design requirement. Various techniques are currently employed to reduce power consumption in such devices. One such technique involves reducing the operating voltage of certain circuits in the device when certain operating conditions exist. As a result, different circuits may operate at different voltages. For example, memory and peripheral circuits that generate write data to write to the memory may operate in different voltage domains. This may cause timing issues when a difference among the voltage domains is substantial.

SUMMARY

Aspects of a memory are disclosed. The memory includes a memory cell configured to be powered from a first voltage, a bitline, and a write driver configured to write to the memory cell through the bitline. The write driver includes a pull-up circuit for coupling to a second voltage. The pull-up circuit is configured to use the first voltage to limit the bitline voltage from being pulled up to the second voltage when the second voltage is greater than the first voltage. The first and second voltages are in different voltage domains.

Further aspects of a memory are disclosed. The memory includes a memory cell configured to be powered from a first voltage, a bitline, and a write driver to write to the memory cell through the bitline. The write driver includes a pull-up circuit for coupling to the second voltage. The pull-up circuit includes means for using the first voltage to limit the bitline voltage from being pulled up to the second voltage when the second voltage is greater than the first voltage. The first and second voltages are from different voltage domains.

Aspects of a method of using a write driver having a pull-up circuit to write to a memory cell through a bitline are disclosed. The memory cell is powered by a first voltage. The pull-up circuit is coupled to a second voltage. The method includes using the first voltage to limit the bitline voltage from being pulled to the second voltage when the second voltage is greater than the first voltage. The first and second voltages are from different voltage domains.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
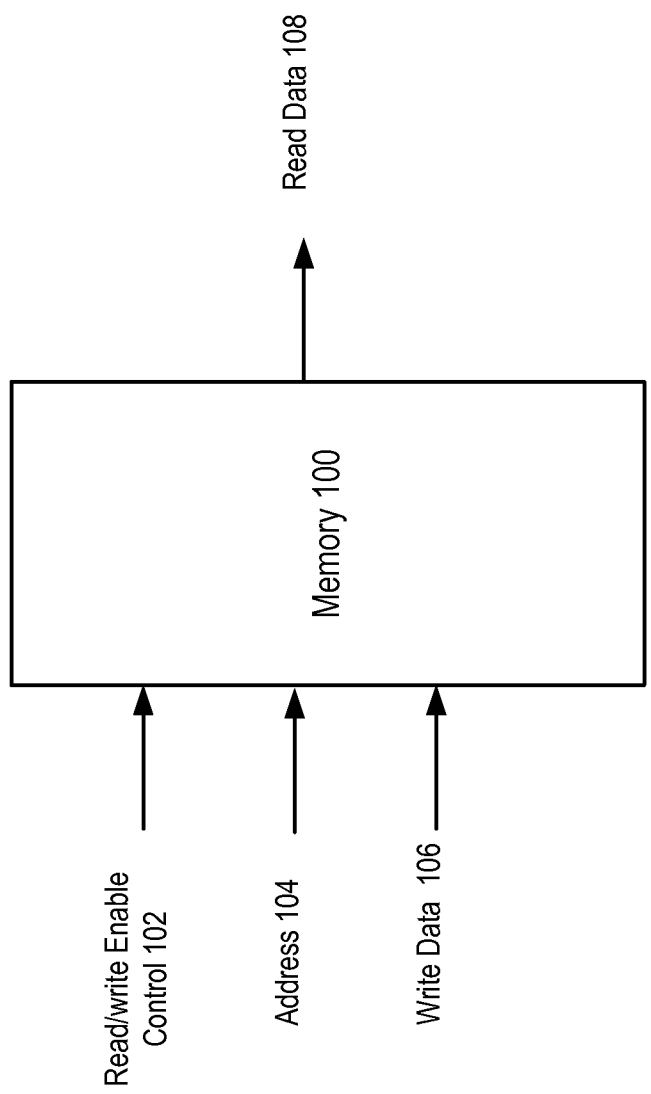
FIG. 1 is a block diagram of an exemplary embodiment of a memory.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories and methods for writing to memory presented throughout this disclosure may be incorporated within various apparatuses. By way of example, various aspects of memories disclosed herein may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like). Various aspects of methods disclosed herein shall similarly be implemented in a stand-alone memory or included in any integrated circuit or system, or any portion of an integrated circuit or system, or any intermediate product or end product, or any step, process, algorithm, or the like, or any combination thereof performed by such stand-alone memory, integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. According all references to an SRAM is intended only to illustrate exemplary aspects of memory with the understanding that such aspects may be extended to a wide range of applications.

FIG. 1 is a block diagram of an exemplary embodiment of a memory 100. The memory 100 provides a medium for peripheral circuits to write and read data (e.g., program instructions and data operated by the instruction). As used hereinafter, the term "data" will be understood to include program instructions, data, and any other information that may be stored in the memory 100. The memory 100 includes an input for a read/write enable control 102 for controlling the read/write operation of the memory 100. The memory 100 also includes inputs for the address 104 and for write data 106 to be written to the memory 100 at the specified address. The memory further includes an output for read data 108 read from the memory 100 at the specified address. When writing data to the memory 100, a peripheral circuit sets the read/write enable control to the write mode and sends to the memory 100 the address along with the write data to be written to the memory 100 at that address. When reading data from the memory 100, the peripheral circuit sets the read/write enable control to the read mode and sends the address to the memory 100. In response, the memory 100 sends read data at that address to the peripheral circuit.

Figure 2:
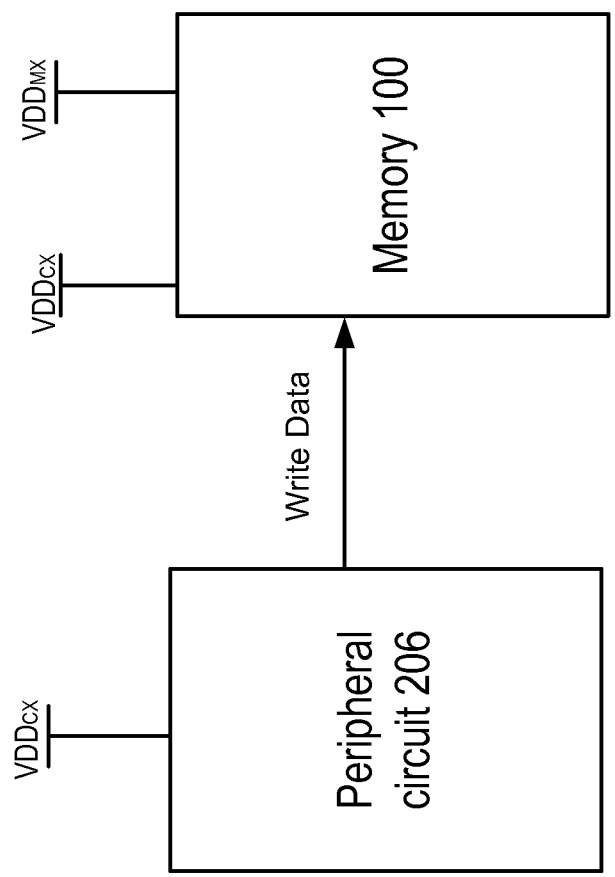
FIG. 2 is a block diagram of an exemplary embodiment of a peripheral circuit supported by a memory.

FIG. 2 is a block diagram 200 of an exemplary embodiment of a peripheral circuit 206 supported by a memory 100. The peripheral circuit 206 and memory 100 may be a system, or part of a larger system, that uses voltage scaling to meet power requirements. This may be achieved by using multiple voltage domains operating at different voltages. By way of example, the peripheral circuit 206 may be configured to write data to the memory 100, which has a memory operating voltage $VDD_{MX}$ supplied from a first voltage source. The peripheral circuit 206, which operates from a second voltage source $VDD_{CX}$, generates the write data. In this exemplary embodiment, the memory 100 also receives power from the second voltage source $VDD_{CX}$ to interface to the peripheral circuit 206. At different times, the memory operating voltage $VDD_{MX}$ may be greater than or less than the peripheral operating voltage $VDD_{CX}$ depending on the particular power requirements of the system.

The peripheral circuit 206 is to be construed broadly to include any suitable circuit that is peripheral to the memory 100 and capable of accessing the memory 100. In this example, the peripheral circuit 206 is shown writing data into the memory 100, however, as those skilled in the art will readily appreciate, the peripheral circuit 206 may also be capable receiving stored data from the memory 100.

Figure 3:
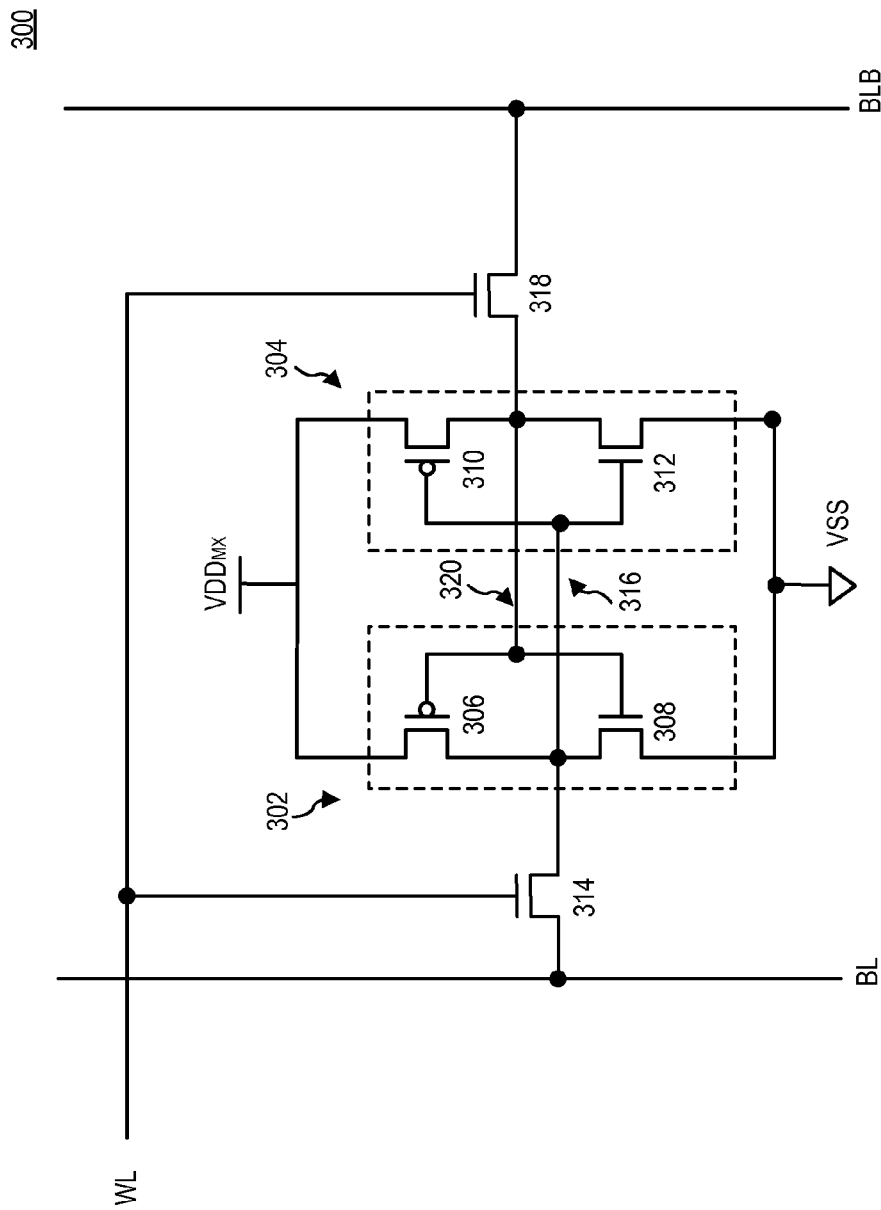
FIG. 3 is a schematic diagram of an exemplary embodiment of a memory cell for an SRAM.

The memory 100 may be any suitable storage medium, such as, by way of example, an SRAM. However, as those skilled in the art will readily appreciate, the memory 100 is not necessarily limited to SRAM. An SRAM includes an array of storage elements know as "cells," "memory cells," or "bitcells." Each memory cell is configured to store one bit of data (e.g., a logic 1 or a logic 0). FIG. 3 is a schematic diagram of an exemplary embodiment of a memory cell 300 for an SRAM. The memory cell is implemented with a six-transistor (6T) configuration. However, as those skilled in the art will readily appreciate, the cell may be implemented with a four-transistor (4T) or any other suitable transistor configuration.

The memory cell 300 is shown with two inverters 302, 304. The first inverter 302 comprises a p-channel transistor 306 and an n-channel transistor 308. The second inverter 304 comprises a p-channel transistor 310 and an n-channel transistor 312. In the described embodiment, the inverters 302 and 304 are powered by $VDD_{MX}$ and have a return VSS (e.g., ground). The memory cell 300 thus stores data in the VDD voltage domain. The first and second inverters 302, 304 are interconnected to form a cross-coupled latch. A first n-channel access transistor 314 couples the output node 316 from the first inverter 302 to a bitline BL and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A write operation may be initiated by setting the bitlines BL and BLB to the value to be written to the memory cell 300 and asserting the wordline WL. The wordline WL may be asserted before the value to be written (e.g., write data) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to $VDD_{MX}$. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver (presented below) is designed to be stronger than the pull-up transistors (306 and 310) in the memory cell 300 so that it can override the previous state of the cross-coupled inverters 302, 304.

Once the write operation is complete, the wordline is deasserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Figure 4:
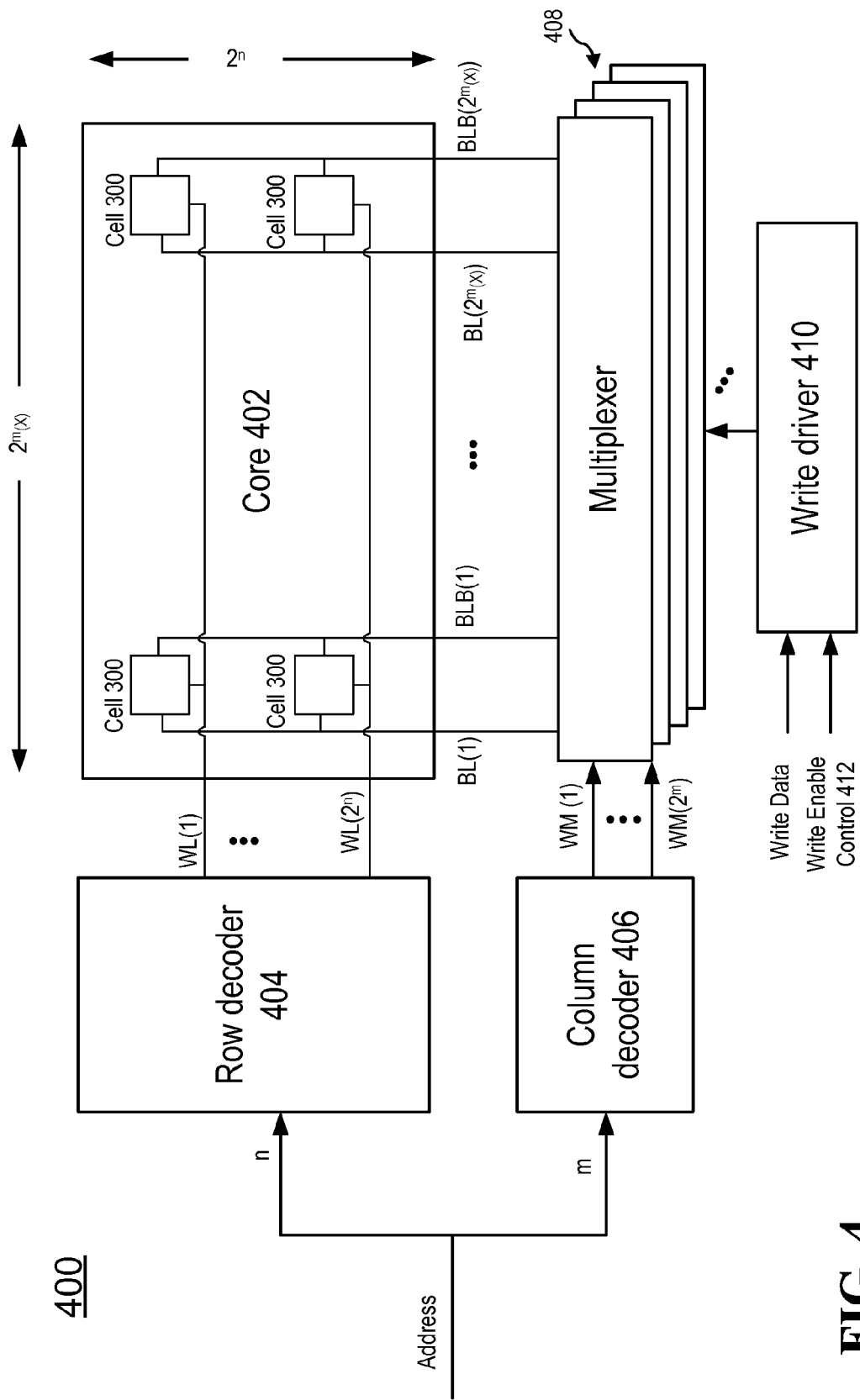
FIG. 4 is a functional block diagram of an exemplary embodiment of an SRAM.

FIG. 4 is a functional block diagram of an exemplary embodiment of an SRAM. Various aspects of an SRAM will now be presented in the context of a write operation. Accordingly, for clarity of presentation, only the connections for the write operation are shown. Those skilled in the art will readily appreciate that additional connections are required to support the read operation.

The SRAM 400 includes a core 402 with supporting circuitry to decode addresses and perform read and write operations. The core 402 is comprised of memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors including the specific application, the speed requirements, the layout and testing requirements, and the overall design constraints imposed on the system. Typically, the core 402 will contain thousands or millions of memory cells.

In the exemplary embodiment of the SRAM shown in FIG. 4, the core 402 is made up of ($2^n \times 2^m(x)$) memory cells 300 arranged in $2^n$ horizontal rows and $2^m(x)$ vertical columns, where $2^m$ is the number of words per row and x is the number of bits per word. A peripheral device (not shown) may randomly access any word (i.e., x cells) in the core 402 using an address that is (n+m) bits wide. In this example, n-bits of the address are provided to the input of a row decoder 404 and m-bits of the address are provided to the input of a column decoder 406. The column decoder 406 provides $2^m$ outputs (WM1-WM$2^m$) with a different one of the outputs asserted for each different combination of address inputs. The outputs are provided to x multiplexers 408. Each multiplexer is $2^m$:1 multiplexer which switches one of x inputs from the write driver 410 between $2^m$ bitline pairs based on the outputs from the column decoder 406. By way of example, a core that stores 4 128-bit words per row requires 128 4:1 multiplexers. Each multiplexer input is coupled to one of 128 outputs from the write driver 410. Based on the decoded m-bit address, each multiplexer couples its input from the write driver 410 to one of 4 bitline pairs. The 4 bitline pairs are coupled to four memory cells, each storing a corresponding bit for a different word in a row. For example, the first of the 4 memory cells may store the least significant bit (LSB) of the first word, the second of the 4 memory cells may store the LSB of the second word, the third of the 4 memory cells may store the LSB of the third word, and the fourth of the 4 memory cells may store the LSB of the fourth word. Thus, when the write enable control 412 is enabled, the write driver 410 drives the write data received from the peripheral device (not shown) onto x pairs of bitlines BL and BLB with each of the x multiplexers driving one pair of bitlines BL and BLB.

The row decoder 404 converts the n-bit address into $2^n$ wordline outputs. A different wordline WL is asserted by the row decoder 404 for each different n-bit row address. As a result, each of the $2^m(x)$ memory cells 300 in the horizontal row with the asserted wordline WL is connected to one pair of the $2^m(x)$ bitlines (BL and BLB) through its access transistors as described above in connection with FIG. 3. The write data is driven, through the x multiplexers 408, onto the selected pairs of bitlines (BL and BLB) and written to the memory cells with the asserted wordline WL, as described with FIG. 3.

Figure 5:
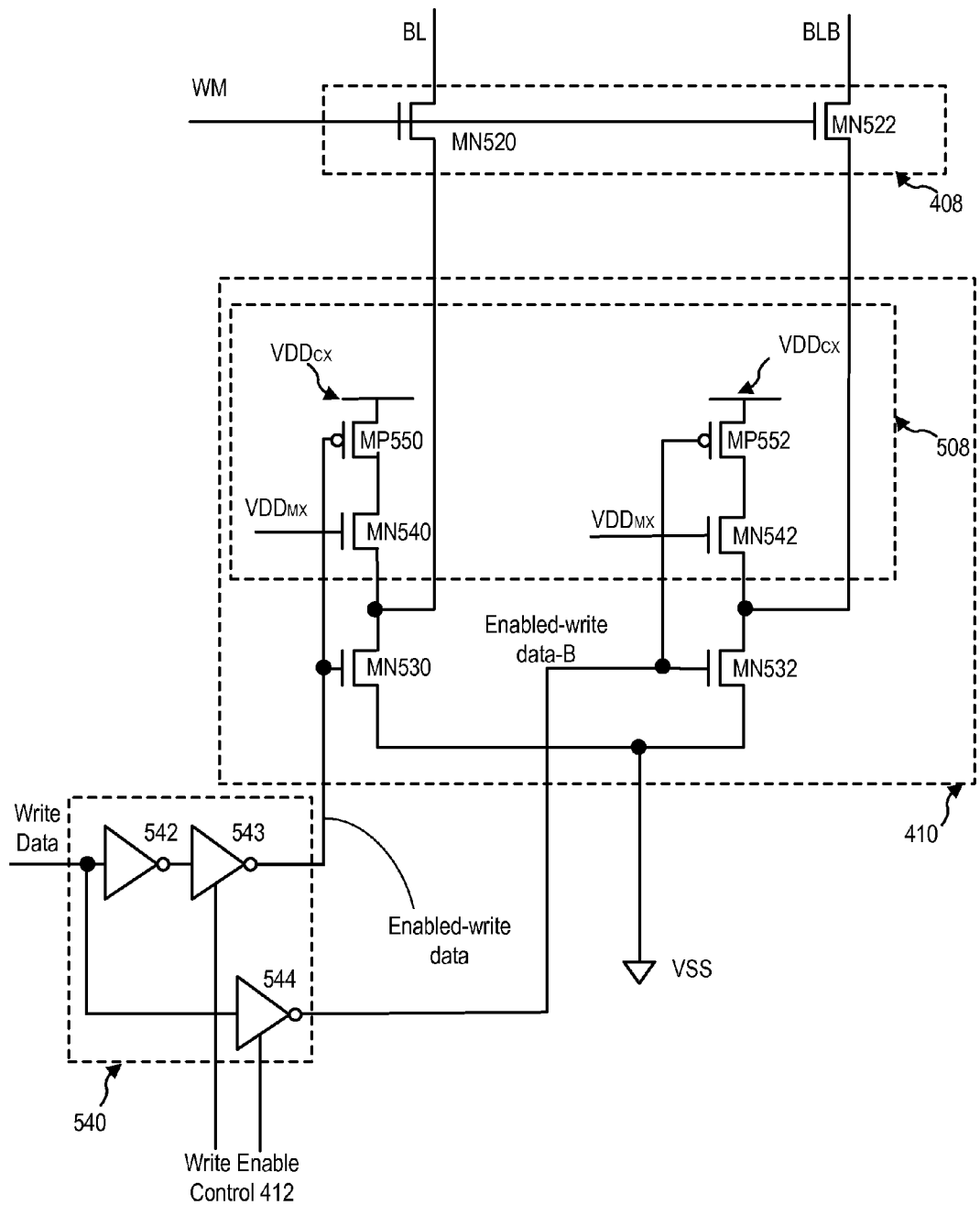
FIG. 5 is a schematic diagram of an exemplary embodiment of a write driver and supporting circuitry.

FIG. 5 is a circuit diagram of an exemplary embodiment of a write driver and supporting circuitry for one bit of write data. As those skilled in the art will appreciate, a separate write driver may be used for each bit of a word to be stored in memory. The circuit diagram includes a write driver 410 that receives write data from a peripheral circuit (not shown) via a write enable circuit 540. The write data is generated from circuitry powered by a voltage source $VDD_{CX}$. The write driver 410 is used to write the data to memory cells powered from a different voltage source $VDD_{MX}$. As will be described in greater detail later, the write driver 410 is configured to provide an interface between the two different voltage domains.

The write enable circuit 540 receives the write data and provides the write data to the write driver 410 when a write enable control 412 is present. The write enable circuit 540 uses two serial inverters 542 and 543 to generate enabled-write data and a single inverter 544 to generate enabled-write data B to provide complementary inputs to the write driver 410. The write enable circuit 540 is provided as an example, and may be implemented in various ways by those skilled in the art.

The outputs from the write enable circuit 540 are used to drive a pull-up circuit 508 and to drive two n-channel pull-down transistors MN530 and MN532 in the write driver. The pull-up circuit 508 will be described in greater detail later. The two n-channel transistors MN530 and MN532 provide a means for pulling down the bitline BL and BLB towards VSS (i.e., the return line for $VDD_{CX}$). The n-channel transistor MN530 has a source connected to VSS, a gate connected to the enabled-write data, and a drain connected to the bitline BL through the multiplexer 408. The n-channel transistor MN532 has a source connected to VSS, a gate connected to enabled-write data-B, and a drain connected to the bitline BLB through the multiplexer 408. As described above, the multiplexer 408 is used to couple the write driver to one of $2^m$ bitline pairs. The write driver is coupled to the bitline pairs BL and BLB shown when the select bit WM is asserted by the column decoder.

In operation, the both the inverters 543 and 544 are disabled in the standby mode. In this mode, both output inverters 543 and 544 are disabled by the write enable control 412. When disabled, the output transistors of inverters 543 and 544 are tri-stated. As a result, no write operation can occur. In the described exemplary embodiment, the inverters 543 and 544 remain disabled until a valid write enable control reaches the write enable circuit 540. Once this occurs, the enabled-write data is provided to the gate of the n-channel transistor MN530 though the two serial inverters 542 and 543, and the enabled-write data B is provided to the gate of the n-channel transistor MN532 through the inverter 544.

The n-channel transistors MN530 and MN532 are coupled to the bitlines BL and BLB, respectively, through the multiplexer 408. The multiplexer 408 includes re-channel transistors MN520 and MN522. Specifically, the n-channel transistor MN520 couples the bitline BL to the transistor MN530 when the write-mux (WM) signal applied to the gate of the transistor is asserted (i.e., logic level 1). Similarly, the n-channel transistor MN522 couples the bitline BLB to the transistor MN532 when the WM signal applied to the gate of the transistor is asserted (i.e., logic level 1).

In the described exemplary embodiment, the n-channel transistor MN530 is turned on when the enabled-write data is at a logic level 1, thereby pulling down the bitline to VSS. The enabled-write data-B remains at a logic level 0, and the n-channel transistor MN532 remains off, thereby disconnecting the bitline BLB from VSS. Conversely, when the enabled-write data is at logic level 0, the n-channel transistor MN530 is turned off and the n-channel transistor MN532 is turned on. In this configuration, the bitline BL is disconnected from the VSS, and the bitline BLB is pulled down to VSS.

A level shifter (not shown) is commonly used to interface two voltage domains. A level shifter typically includes two cross-coupled p-channel transistors that may be connected to the bitlines BL and BLB and powered by $VDD_{MX}$. However, when $VDD_{MX}$ is greater than $VDD_{CX}$, the n-channel transistors MN530 and MN532 have to fight with the cross-coupled transistors in the level shifter in addition to the p-channel transistors 306 and 310 in the memory cell 300 (see FIG. 3) to pull down the bitlines BL and BLB. As a result, the n-channel transistors MN530 and MN532 may not be able to sufficiently pull down the appropriate bitline BL or BLB when $VDD_{CX}$ is lower than VDDMX, thereby causing a write failure. To reduce the likelihood of a write failure under these conditions, the pull-up circuit 508 may be used instead of a level shifter. The pull-up circuit may be configured to pull-up the appropriate bitline BL or BLB towards $VDD_{CX}$ through the multiplexer 408 while limiting the pull-up voltage to less than $VDD_{MX}$ to avoid applying an input voltage to the memory cell that exceeds $VDD_{MX}$ when $VDD_{CX}$ is greater than $VDD_{MX}$. As explained earlier, the other bitline is pulled down to VSS at the same time.

The pull-up circuit 508 includes p-channel transistor MP550 and the n-channel transistor MN540 connected in series between $VDD_{CX}$ and the drain of the n-channel transistor MN530. The pull-up circuit 508 also includes p-channel transistor MP552 and the n-channel transistor MN542 connected in series between $VDD_{CX}$ and the drain of the n-channel transistor MN532. The p-channel transistor MP550 includes a source connected to $VDD_{CX}$, a gate connected the enabled-write data, and a drain connected to the drain of the n-channel transistor MN540. The gate of the n-channel transistor MN540 is connected to $VDD_{MX}$ and the source of the n-channel transistor MN540 is connected to the bitline BL through the multiplexer 408. The p-channel transistor MP552 includes a source connected to $VDD_{CX}$, a gate connected the enabled-write data-B, and a drain is connected to the drain of the n-channel transistor MN542. The gate of the n-channel transistor MN542 is connected to $VDD_{MX}$ and the source of the n-channel transistor MN542 is connected to the bitline BLB through the multiplexer 408. In this embodiment, the n-channel transistors provide a means for using $VDD_{MX}$ to limit their respective bitline voltages from being pulled up to $VDD_{CX}$ when $VDD_{CX}$ is greater than $VDD_{MX}$.

An example illustrating the operation of the pull-up circuit 508 will now be presented. In this example, the write driver 410 will be used to pull up the bitline BL when the WM signal is asserted (i.e., logic level 1). Initially, both bitlines BL and BLB are precharged to $VDD_{MX}$ before being coupled to their respective outputs in the memory cell via their respective access transistors (see FIG. 3). The enabled-write data is driven low (i.e., a logic state 0), which drives the p-channel transistor MP550 into saturation due to the large negative gate-to-source voltage $V_{GS}$ ($-VDD_{CX}$). With the enabled-write data low, the gate-to-source voltage $V_{GS}$ of the n-channel transistor MN530 is below the threshold voltage $V_{THS}$, and therefore, is forced into forced into the cut-off region (i.e., the n-channel transistor MN 530 is turned off). As a result, the drain of the n-channel transistor MN540 is coupled to $VDD_{CX}$ through the n-channel transistor MP550. The source is of the n-channel transistor MN540 is coupled to the pull-down transistor 308 in the memory cell 300 via the n-channel transistor MN520 in the multiplexer 408 and the access transistor 314 in the memory cell 300 (see FIG. 3).

If $VDD_{CX}$ is greater than $VDD_{MX}$ and the bitline BL is precharged to $VDD_{MX}$, the BL bitline will begin to discharge through the pull-down transistor 308 in the memory cell 300 until the voltage falls to $VDD_{MX}$ minus the threshold voltage $V_T$ of the n-channel transistor MN540. Once this occurs, the gate-to-source voltage $V_{GS}$ of the re-channel transistor will be at the threshold voltage $V_T$, thereby forcing the transistor into the linear region of operation. If, on the other hand, the bitline BL is precharged to a voltage that is less than or equal to $VDD_{MX}$ minus the threshold voltage $V_T$ of the re-channel transistor MN540, then the bitline will not need to be discharge to force the transistor into the linear region of operation. Either way, once the n-channel transistor MN540 begins operating in the linear region, the bitline voltage will stabilize at $VDD_{MX}-V_T$. Because the transistors in the pull-up circuit 508 are stronger than the transistors in the memory cell 300, the bitline BL will not be pulled down to VSS by the pull-down transistor 308.

When $VDD_{CX}$ is less than $VDD_{MX}$, the n-channel transistor MN540 will be forced into the linear mode of operation once the source voltage is at $VDD_{MX}$ minus the threshold voltage $V_T$. In this case, however, the bitline BL voltage will continue to fall until the n-channel transistor MN540 is driven into saturation due to the increasing gate-to-source voltage $V_{GS}$. With both the p-channel transistor MP550 and the n-channel transistor MN540 operating in the saturation region, the bitline BL will be coupled to $VDD_{CX}$. Once this occurs, the bitline BL voltage will stabilize at $VDD_{CX}$, or thereabouts. There may be a small voltage drop across the drain-to-source of the re-channel and p-channel transistors MN540 and MP550. Because the transistors in the pull-up circuit 508 are stronger than in the transistors in the memory cell 300, the bitline BL will not be pulled down to VSS by the pull-down transistor 308.

The p-channel transistor MP552 and the n-channel transistor MN542 in the pull-up circuit 508 operate in a similar fashion when pulling up the bitline BLB.

Figure 6:
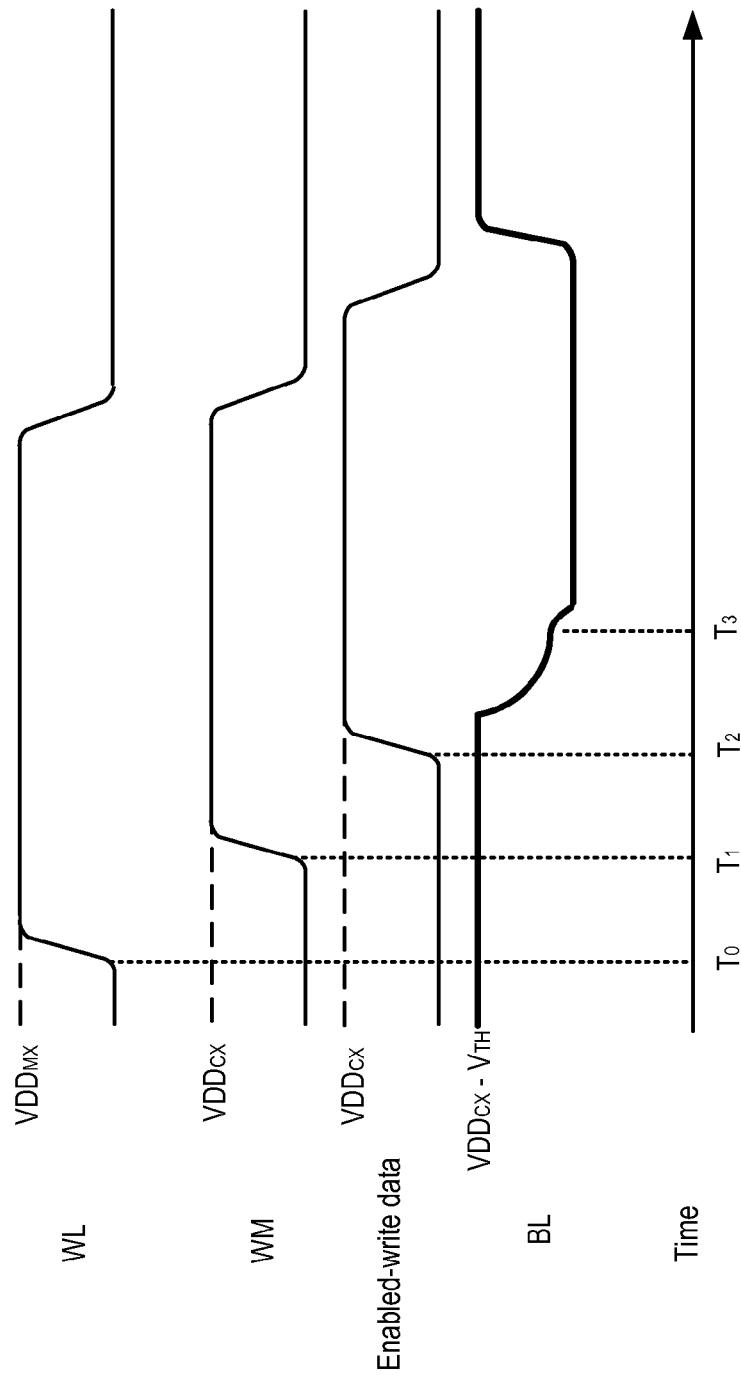
FIG. 6 is a timing diagram of a write operation of an exemplary embodiment of a write driver.

FIG. 6 is a timing diagram of a write operation of exemplary embodiment of a write driver. The write operation will be described with reference to FIGS. 3-6. In this example, the memory cell 300 stores a logic 1 at the output of the inverter 302, and stores a logic 0 at the output of the inverter 304.

At $T_0$, the wordline WL is asserted (e.g., driven to $VDD_{MX}$), thereby connecting the bitlines BL and BLB to memory cell 300. Specifically, the bitline BL is connected to the output of the inverter 302 through the access transistor 314, and the bitline BLB is connected to the output of the inverter 304 through the access transistor 318. The bitline BLB, which was pre-charged before the write operation, begins discharging through the n-channel transistor 312 in the inverter 304 toward VSS (i.e., a logic level 0). The bitline BL remains charged (i.e., logic level 1).

At $T_1$, the WM signal is asserted (e.g., driven to $VDD_{MX}$), selecting the bitlines BL and BLB for the write operation and connecting the bitlines BL and BLB to the write driver 410.

At $T_2$, the write enable control 412 is asserted. With the write enable control asserted, write enable circuit 540 provides the write data to the write driver 410. In this example, the write enable circuit 540 drives the enabled-write data to a high state (i.e., logic level 1) and the enabled-write data-B to a low state (i.e., logic level 0). The enabled-write data turns off the p-channel transistor MP550 and turns on the n-channel transistor MN530, thereby pulling down the bitline BL. The enabled-write data-B turns on the p-channel transistor MP552 and turns off the n-channel transistor MN532. As a result, the bitline BLB is pulled up through p-channel transistor MP552 and n-channel transistor MN542. As described in greater detail earlier, the bitline BLB will be pulled up towards $VDD_{CX}$ while limited by $VDD_{MX}$ to protect the memory cell when $VDD_{CX}$ is high compared to $VDD_{MX}$. In the described exemplary embodiment, the write driver 410 (in particular n-channel transistor MN530) is strong enough to pull down the bitline BL because it does not have any pull-up circuits that might be operative in a level shifter pulling the bitline BL up.

At $T_3$, the bitline BL is pulled low enough to flip or overwrite the data stored in the memory cell 300. The low state on the bitline BL turns on the p-channel transistor 310 and turns off the n-channel transistor 312 in the memory cell 300, thereby pulling up the output node 320 of the inverter 304. The output of the inverter is fed back to the input of the inverter 302, thereby turning off the p-channel transistor 306 and turning on the n-channel transistor 308. The n-channel transistor 308 maintains the low state and thereby stores the logic level 0.

Figure 7:
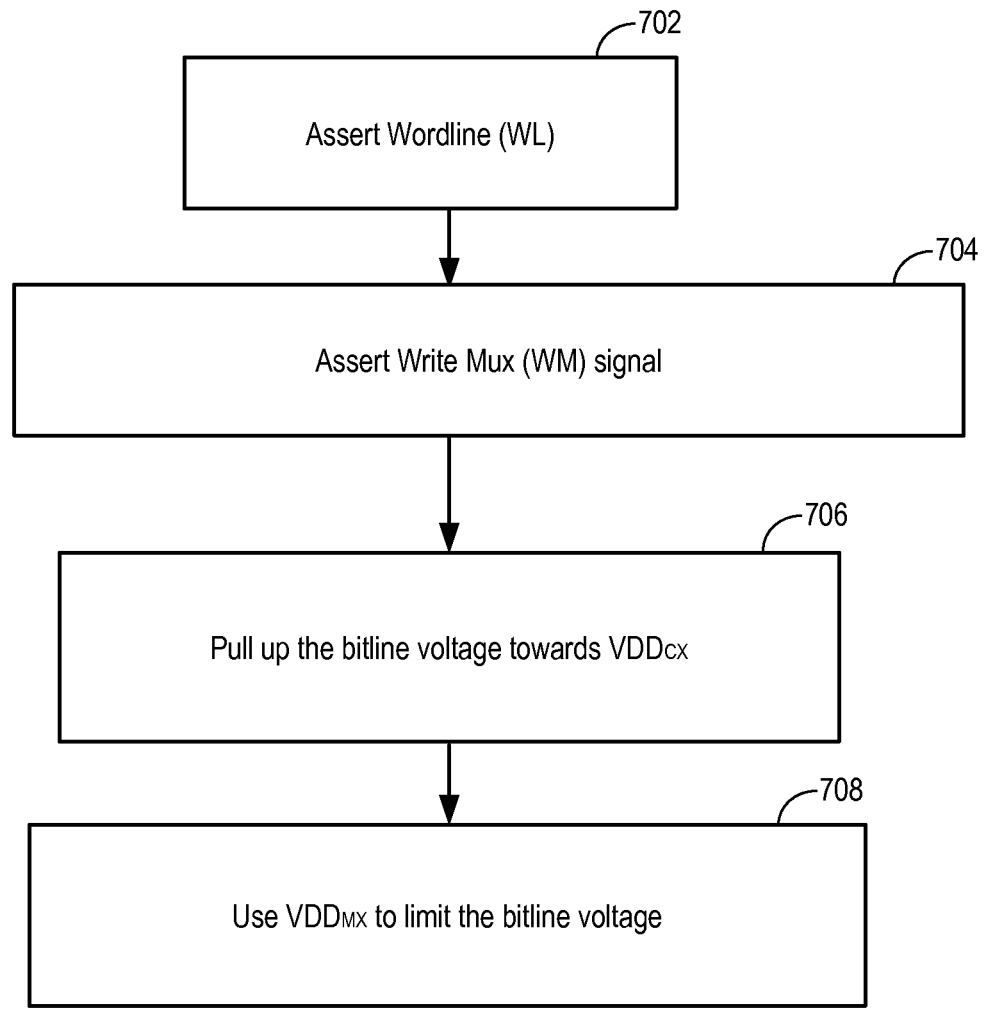
FIG. 7 is the flowchart of a write operation of an exemplary embodiment of a write driver.

FIG. 7 is the flowchart illustrating a write operation for an exemplary embodiment of a write driver. In this example, the write driver is used to pull up a bitline. The write operation begins by asserting the wordline WL (702). As explained in greater detail earlier, the assertion of the wordline WL connects the bitline to the memory cell. Once the wordline WL is asserted, the WM signal is asserted (704), thereby connecting the write driver to the bitline. The connection may be made with an n-channel transistor MN520 as shown in FIG. 5 or by some other suitable multiplexing means. With both the wordline WL and WM signal asserted, the write driver now has access to the memory cell. The write driver pulls up the bitline voltage towards $VDD_{CX}$ (706). To the extent that $VDD_{CX}$ exceeds $VDD_{MX}$, the voltage source $VDD_{MX}$ for the memory cell may be used to limit the bitline voltage (708). A series arrangement of transistors, such as the transistors MP550 and MP540 shown in FIG. 5, may be used to pull up the bitline voltage towards $VDD_{CX}$ while limiting the bitline voltage by $VDD_{MX}$.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A memory, comprising:
    a memory cell configured to be powered from a first voltage;
    a bitline; and
    a write driver configured to write to the memory cell through the bitline, the write driver comprising a pull-up circuit for coupling to a second voltage, the write driver being configured to use the first voltage to limit a bitline voltage from being pulled up to the second voltage when the second voltage is greater than the first voltage, the first and second voltages being in different voltage domains.

2. The memory of claim 1, wherein the pull-up circuit comprises two series transistors to drive the bitline from the second voltage.

3. The memory of claim 2, wherein the two series transistors comprise a first transistor for coupling to the second voltage and a second transistor configured to limit the bitline voltage.

4. The memory of claim 3, wherein the first transistor comprises a gate responsive to write data and the second transistor comprises a gate for coupling to the first voltage.

5. The memory of claim 1, further comprising a pull-down circuit to pull down the bitline voltage to a return for the second voltage.

6. The memory of claim 1, wherein the pull-up circuit comprises:
    a p-channel transistor having a source for coupling to the second voltage, a gate responsive to write data, and a drain; and
    an n-channel transistor having a drain coupled to the drain of the p-channel transistor, a gate for coupling to the first voltage, and a source coupled to the bitline.

7. The memory of claim 6, further comprising a pull-down circuit including a re-channel transistor having a source coupled to the bitline, a gate responsive to complimentary write data, and a drain for coupling to a return for the second voltage.

8. A memory, comprising:
    a memory cell configured to be powered from a first voltage;
    a bitline; and
    a write driver to write to the memory cell through the bitline, the write driver comprising a pull-up circuit for coupling to a second voltage, the pull-up circuit comprising means for using the first voltage to limit a bitline voltage from being pulled up to the second voltage when the second voltage is greater than the first voltage, the first and second voltages being in different voltage domains.

9. The memory of claim 8, wherein the pull-up circuit comprises a first transistor and the means for using the first voltage to limit the bitline voltage comprises a second transistor, the first and second transistors being arranged in series to drive the bitline from the second voltage.

10. The memory of claim 9, wherein the first transistor is configured for coupling to the second voltage and the second transistor is configured to limit the bitline voltage.

11. The memory of claim 10, wherein the first transistor comprises a gate responsive to write data and the second transistor comprises a gate for coupling to the first voltage.

12. The memory of claim 8, further comprising means for pulling down the bitline voltage towards a return for the second voltage.

13. The memory of claim 8, wherein:
    the pull-up circuit comprises a p-channel transistor having a source for coupling to the second voltage, a gate responsive to write data, and a drain, and
    the means for using the first voltage to limit the bitline voltage comprises an re-channel transistor having a drain coupled to the drain of the p-channel transistor, a gate for coupling to the first voltage, and a source coupled to the bitline.

14. The memory of claim 13, further comprising means for pulling down the bitline voltage.

15. The memory of claim 14, wherein the means for pulling down the bitline voltage comprises a n-channel transistor having a source coupled to the bitline, a gate responsive to complimentary write data, and a drain coupled to a return for the second voltage.

16. A method of using a write driver having a pull-up circuit to write to a memory cell through a bitline, the memory cell being powered from a first voltage and the pull-up circuit being coupled to a second voltage, the method comprising:
   using the first voltage to limit a bitline voltage from being pulled up to the second voltage when the second voltage is greater than the first voltage;
   wherein the first and second voltages are from different voltage domains.

17. The method of claim 16, wherein the first voltage is used to limit the bitline voltage to a voltage less that the first voltage when the second voltage is greater than the first voltage.

18. The method of claim 17, further comprising pulling up the bitline voltage to the second voltage when the second voltage is less than the first voltage.

* * * * *